United States Patent
Lee

(10) Patent No.: US 10,083,758 B2
(45) Date of Patent: Sep. 25, 2018

(54) SEMICONDUCTOR MEMORY DEVICE AND OPERATING METHOD THEREOF

(71) Applicant: SK hynix Inc., Gyeonggi-do (KR)

(72) Inventor: Yeonghun Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 18 days.

(21) Appl. No.: 15/077,681

(22) Filed: Mar. 22, 2016

(65) Prior Publication Data

US 2017/0125102 A1 May 4, 2017

(30) Foreign Application Priority Data

Nov. 3, 2015 (KR) .................. 10-2015-0153930

(51) Int. Cl.
G11C 11/34 (2006.01)
G11C 16/34 (2006.01)
G11C 16/10 (2006.01)

(52) U.S. Cl.
CPC .......... G11C 16/3459 (2013.01); G11C 16/10 (2013.01)

(58) Field of Classification Search
CPC ...................... G11C 16/3459; G11C 16/10
See application file for complete search history.

(56) References Cited

U.S. PATENT DOCUMENTS

| | | | | |
|---|---|---|---|---|
| 2005/0157552 A1* | 7/2005 | Hemink | ............... | G11C 11/5628 365/185.03 |
| 2008/0056007 A1* | 3/2008 | Kang | .................. | G11C 11/5628 365/185.22 |
| 2011/0292724 A1* | 12/2011 | Kim | .................... | G11C 16/0483 365/185.03 |
| 2013/0094292 A1* | 4/2013 | Park | .................... | G11C 11/5628 365/185.03 |
| 2014/0140137 A1* | 5/2014 | Kondo | ................ | G11C 11/5628 365/185.17 |
| 2016/0049200 A1* | 2/2016 | Park | .................... | G11C 16/3459 365/185.19 |

FOREIGN PATENT DOCUMENTS

| KR | 1020140091839 | 7/2014 |
|---|---|---|
| KR | 1020150000572 | 1/2015 |

* cited by examiner

*Primary Examiner* — Mohammed A Bashar
(74) *Attorney, Agent, or Firm* — IP & T Group LLP

(57) ABSTRACT

A memory device includes a plurality of memory cells each programmed to have any one program state among a plurality of program states divided based on a threshold voltage thereof, and a peripheral circuit for performing a main program operation on the plurality of memory cells, and performing an additional program operation on at least one memory cell of which a threshold voltage regarding the main program operation is changed while the main program operation is being performed.

20 Claims, 8 Drawing Sheets

SEMICONDUCTOR MEMORY DEVICE AND OPERATING METHOD THEREOF

CROSS-REFERENCE TO RELATED APPLICATION

The present application claims a priority to a Korean patent application number 10-2015-0153930 filed on Nov. 3, 2015, the entire invention of which is incorporated herein in its entirety by reference.

BACKGROUND

1. Field

Embodiments of the present invention relate to a semiconductor memory device and an operating method thereof.

2. Description of the Related Art

A semiconductor memory device is a memory device implemented on a semiconductor material. Suitable known semiconductor materials include silicon (Si), germanium (Ge), gallium arsenide (GaAs), indium phosphide (InP) or any combinations thereof. A semiconductor memory device is generally classified into a volatile or nonvolatile memory device.

A volatile memory device does not retain stored data when a power supply is cut off. Examples of volatile memory devices include a static random access memory (SRAM), a dynamic RAM (DRAM), a synchronous DRAM (SDRAM), and the like. A nonvolatile memory device retains stored data even when a power supply is cut off. Examples of nonvolatile memory devices include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. Flash memory devices are used widely and is generally classified into NOR or NAND flash type.

SUMMARY

Embodiments of the present invention provide a semiconductor memory device having an improved program speed and an operating method thereof.

According to an aspect of the present invention, a method of operating a memory device may include performing a main program operation on a plurality of memory cells, and performing an additional program operation on at least one memory cell of which a threshold voltage regarding the main program operation is changed while the main program operation is being performed.

According to an aspect of the present invention, a method of operating a memory device including a plurality of memory cells each programmed to have any one program state among a plurality of program states divided based on a threshold voltage thereof, may include verifying the plurality of memory cells programmed to have an arbitrary nth program state among the plurality of program states by using a verification voltage corresponding to the nth program state, and if the verification fails, applying a program pulse corresponding to the nth program state to a word line to which the plurality of memory cells are connected.

According to an aspect of the present invention, a memory device may include a plurality of memory cells each programmed to have any one program state among a plurality of program states divided based on a threshold voltage thereof, and a peripheral circuit configured to perform a main program operation on the plurality of memory cells, and perform an additional program operation on at least one memory cell of which a threshold voltage regarding the main program operation is changed while the main program operation is being performed.

According to an aspect of the present invention, a memory device may include a plurality of memory cells each programmed to have any one program state among a plurality of program states divided based on a threshold voltage thereof, and a peripheral circuit configured to verify the plurality of memory cells programmed to have an arbitrary nth program state among the plurality of program states by using a verification voltage corresponding to the nth program state, and if the verification fails, apply a program pulse corresponding to the nth program state to a word line to which the plurality of memory cells are connected.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this invention will be thorough and complete to those skilled in the art to which this invention pertains.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the present invention. It is noted, however, that the invention can be implemented in various forms, and cannot be construed as being limited to the embodiments set forth herein.

The described embodiments can be variously modified and have various shapes.

While terms such as "first" and "second" may be used to describe various components, such components must not be understood as being limited to the above terms. The above terms are used only to distinguish one component from another. For example, a first component may be referred to as a second component without departing from the scope of rights of the present invention, and likewise a second component may be referred to as a first component.

It will be understood that when an element is referred to as being "connected to" another element, it can be directly connected to the other element or intervening elements may also be present. In contrast, when an element is referred to as being "directly connected to" another element, no intervening elements are present. Meanwhile, other expressions describing relationships between components such as "between," "immediately between" or "adjacent to" and "directly adjacent to" may be construed similarly.

The terms used in the present application are merely used to describe particular embodiments, and are not intended to limit the present invention. Singular forms in the present invention are intended to include the plural forms as well, unless the context clearly indicates otherwise. It will be further understood that terms such as "comprising," "Including," "having," and the like, are intended to indicate the existence of the features, numbers, operations, actions, components, parts, or combinations thereof disclosed in the specification, and are not intended to preclude one or more other features, numbers, operations, actions, components, parts, or combinations thereof that may exist or may be added.

So far as not being differently defined, all terms used herein including technical or scientific terminologies have meanings that they are commonly understood by those skilled in the art to which the present invention pertains. The terms having the definitions as defined in the dictionary should be understood such that they have meanings consistent with the context of the related technique. So far as not being clearly defined in this application, terms should not be understood in an ideally or excessively formal way.

Hereinafter, exemplary embodiments of the present invention will be described in detail with reference to the accompanying drawings.

Figure 1:
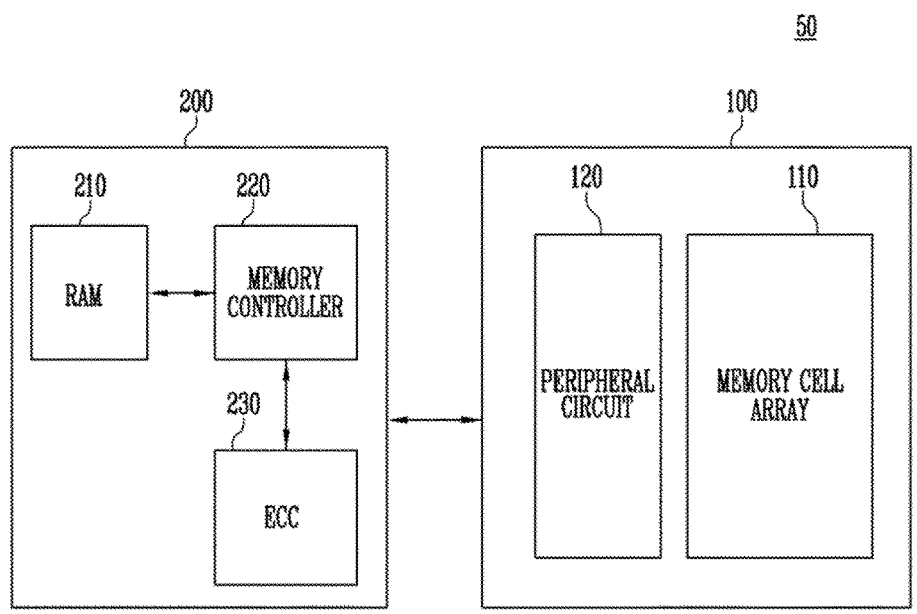
FIG. 1 is a block diagram illustrating a memory system, according to an embodiment of the present invention.

Referring to FIG. 1, a block diagram illustrating a memory system 50 according to an embodiment of the present invention is provided. The memory system 50 may include a semiconductor memory device 100 and a controller 200.

The semiconductor memory device 100 may include one of a NAND flash memory, a vertical NAND flash memory, a NOR flash memory, a resistive random access memory (RRAM), a phase-change random access memory (PRAM), a magnetroresistive random access memory (MRAM), a ferroelectric random access memory (FRAM), a spin transfer torque random access memory (STT-RAM), or the like. The semiconductor memory device 100 may be implemented in a three-dimensional (3D) array structure. Embodiments of the present invention may be applied not only to a flash memory device in which a charge storage layer is formed by a conductive floating gate (FG) but also to a charge trap flash (CTF) memory in which a charge storage layer is formed of an insulation film.

The semiconductor memory device 100 may include a memory cell array 110 and a peripheral circuit 120 for driving the memory cell array 110. The memory cell array 110 may include a plurality of memory cells.

The memory cell array 110 may include a plurality of memory blocks, and the plurality of memory blocks may be divided into system blocks, user blocks, and the like according to their uses.

The peripheral circuit 120 may operate in response to control of the controller 200. The peripheral circuit 120 may program data in the memory cell array 110 in response to control of the controller 200. The peripheral circuit 120 may read data from the memory cell array 110 and erase data of the memory cell array 110.

In an embodiment, read and program operations of the semiconductor memory device 100 may be performed in units of pages. In an embodiment, an erase operation of the semiconductor memory device 100 may be performed in units of blocks.

When a program operation is performed, the peripheral circuit 120 may receive from controller 100 a command indicating a program operation, a physical block address (PBA) or a physical address (PA), and write data. If one memory block and one page included in the corresponding memory block are selected by the physical block address, the peripheral circuit 120 may program the write data in the selected page.

When a read operation is performed, the peripheral circuit 120 may receive, from the controller 200, a command indicating a read operation (hereinafter, referred to as a read command) and a physical block address. The peripheral circuit 120 may read data from one memory block and one page included therein, which are selected by the physical block address, and output the read data (hereinafter, referred to as page data) to the controller 200.

When an erase operation is performed, the peripheral circuit 120 may receive from the controller 200 a command indicating an erase operation and a physical block address. The physical block address may specify one memory block. The peripheral circuit 120 may erase data of a memory block corresponding to the physical block address.

The controller 200 controls one or more operations of the semiconductor memory device 100. The controller 200 may access the semiconductor memory device 100 in response to a request from an external host (not shown). The controller 200 may command the semiconductor memory device 100 in response to the request from the external host.

In an embodiment, the controller 200 may control the semiconductor memory device 100 to perform one of a program operation, a read operation, an erase operation, or the like. For a program operation, the controller 200 may provide a program command, an address, and data to the semiconductor memory device 100 through a channel. For a read operation, the controller 200 may provide a read command and an address to the semiconductor memory device 100 through a channel. For an erase operation, the controller 200 may provide an erase command and an address to the semiconductor memory device 100 through a channel.

The controller 200 may include a random access memory (RAM) 210, a memory controller 220, and an error correction code (ECC) circuit 230.

The RAM 210 may be controlled by the memory controller 220. The RAM may be used as a work memory, a buffer memory, a cache memory, or the like. When the RAM 210 is used as a work memory, the RAM 210 may arbitrarily store data processed by the memory controller 220. When the RAM 210 is used as a buffer memory, the RAM 210 may be used to buffer data to be transmitted from a host (not shown) to the semiconductor memory device 100 or from the semiconductor memory device 100 to the host.

The memory controller 220 may control one of read, program, erase, and background operations of the semiconductor memory device 100. The memory controller 220 may drive firmware for controlling the semiconductor memory device 100.

The memory controller 220 may translate a logical block address (LBA) provided from the host to a physical block address (PBA) through a flash translation layer (FTL). Specifically, the FTL may receive the logical block address by using a mapping table, and translate the received logical block address to the physical block address. The physical block address may be a page number specifying a specific word line of the memory cell array 110. Various address mapping methods of the FTL may be used. In some embodiments, address mapping methods may include one of a page mapping method, a block mapping method, and a hybrid mapping method.

The ECC circuit 230 may employ any suitable error correction scheme for detecting and correcting data. For example, the ECC circuit 230 may employ any one well-known parity based scheme as an error correction code for data to be programmed or read data.

The ECC circuit 230 may correct errors in data using a coded modulation scheme including but not limited to a low density parity check (LDPC) code, a Bose-Chaudhuri and Hocquenghem (BCH) code, a turbo code, a Reed-Solomon (RS) code, a convolution code, a recursive systematic code (RSC), a trellis-coded modulation (TCM), a block coded modulation, a Hamming code, and the like.

When a read operation is performed, the ECC circuit 230 may correct an error of read page data. When error bits exceeding a correctable bit number are included in the read page data, the decoding may fail. When error bits equal to or smaller than the correctable bit number are included in the read page data, the decoding may succeed.

Success in the decoding means that a corresponding read command passes. Failure in the decoding means that the corresponding read command fails. When the decoding succeeds, the controller 200 may output to the host page data which have been corrected for any errors.

The controller 200 may include a host interface (not shown). The host interface may include a protocol for exchanging data between the external host and the controller 200. In some embodiments, the controller 200 may be configured to communicate with the external host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol and the like.

Figure 2:
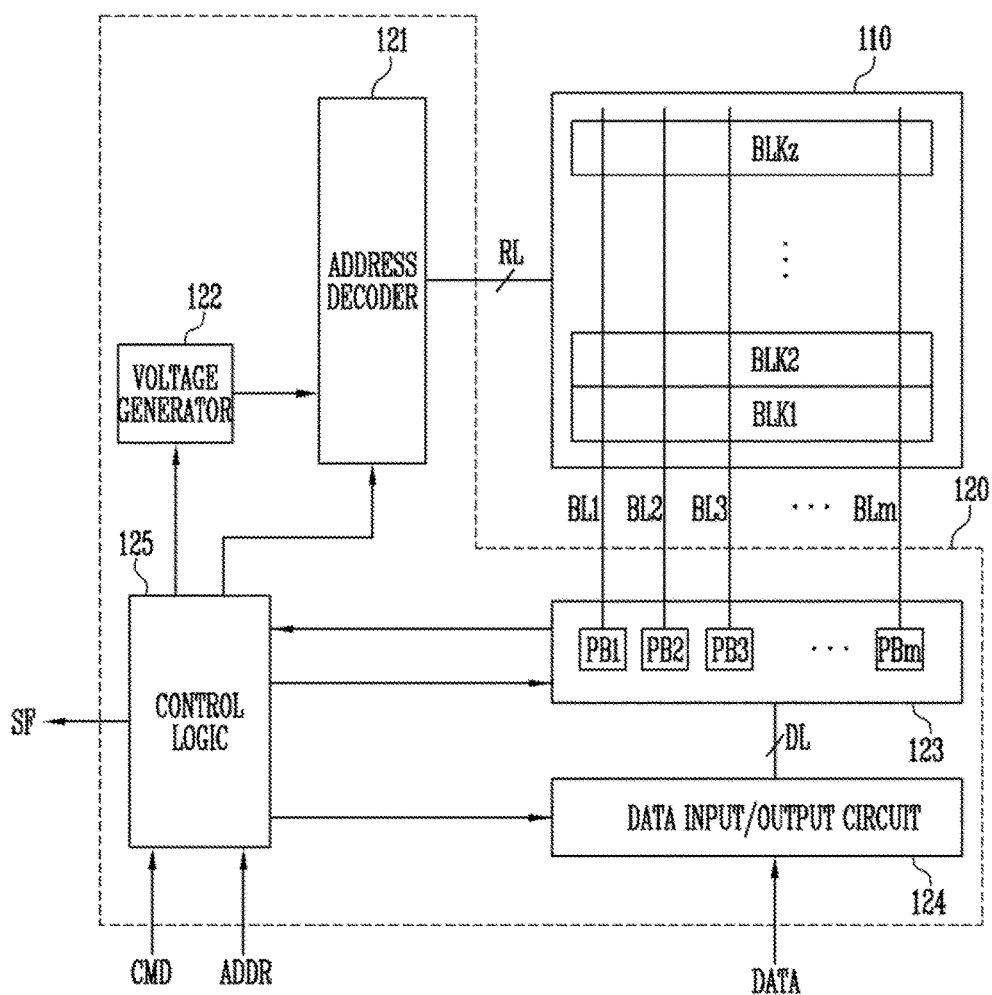
FIG. 2 is a block diagram illustrating a memory device, according to an embodiment of the present invention.

FIG. 2 is a block diagram illustrating a memory device according to an embodiment of the present invention. For example, the memory device of FIG. 2 may be the semiconductor memory device 100 of FIG. 1.

Referring to FIG. 2, the semiconductor memory device 100 may include a memory cell array 110 and a peripheral circuit 120. The peripheral circuit 120 may include an address decoder 121, a voltage generator 122, a read/write circuit 123, a data input/output circuit 124, and a control logic 125.

The memory cell array 110 may include a plurality of memory blocks BLK1 to BLKz. The plurality of memory blocks BLK1 to BLKz may be connected to the address decoder 121 through row lines RL, and to the read/write circuit 123 through bit lines BL1 to BLm. Each of the plurality of memory blocks BLK1 to BLKz may include a plurality of memory cells. In some embodiments, the plurality of memory cells may be nonvolatile memory cells.

The plurality of memory cells included in the memory cell array 110 may be divided into a plurality of blocks according to their uses. For example, the plurality of blocks may be divided into a main block and an extra block. Various set-up information on operations of the memory cells may be stored in the extra block.

Figure 3:
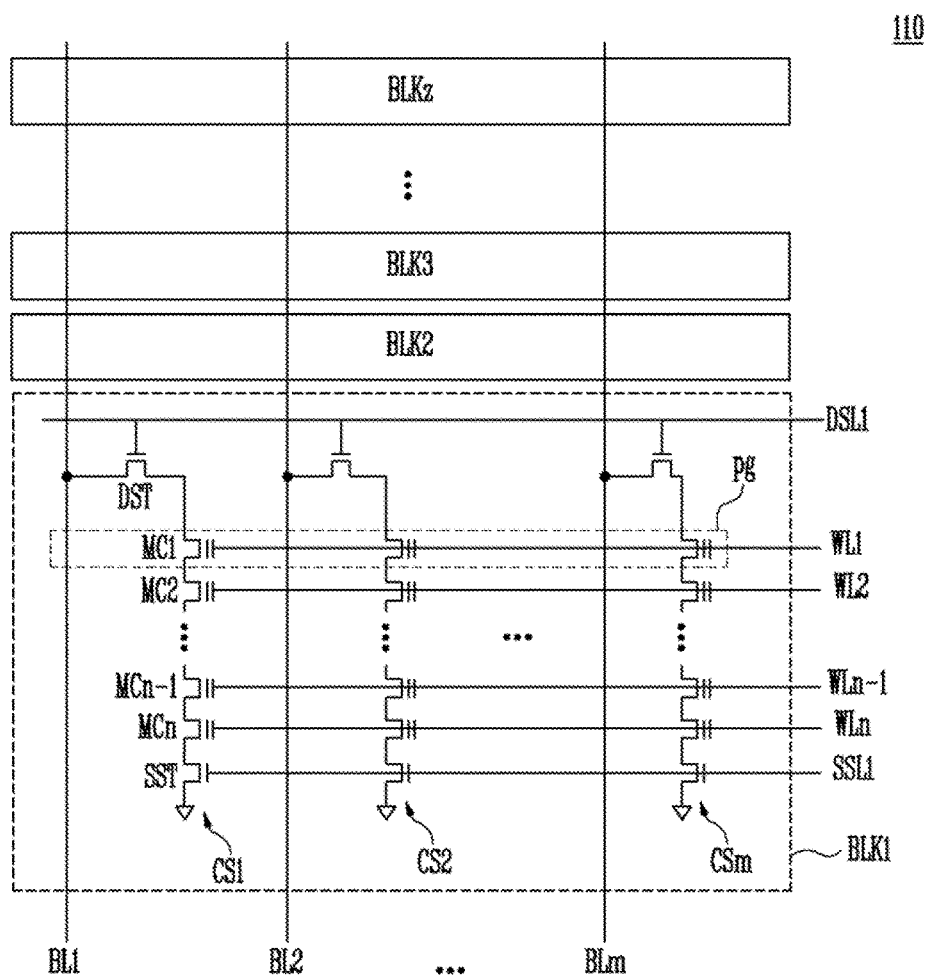
FIG. 3 is a diagram illustrating a structure of a memory cell array, according to an embodiment of the present invention.

FIG. 3 is a diagram illustrating a structure of a memory cell array, according to an embodiment of the present invention. For example, the memory cell array of FIG. 3 may be the memory cell array 110 of FIG. 2.

Referring to FIG. 3, first to zth memory blocks BLK1 to BLKz may be commonly connected to first to mth bit lines BL1 to BLm. For convenience of description, components included in the first memory block BLK1 among the plurality of memory blocks BLK1 to BLKz are illustrated, and components included in each of the other memory blocks BLK2 to BLKz are omitted. It will be understood that each of the other memory blocks BLK2 to BLKz may be configured similarly to the first memory block BLK1.

The memory block BLK1 may include a plurality of cell strings CS1 to CSm. First to mth cell strings CS1 to CSm may be connected to the first to mth bit lines BL1 to BLm, respectively.

Each of the first to mth cell strings CS1 to CSm may include a drain select transistor DST, a plurality of memory cells MC1 to MCn connected in series, and a source select transistor SST. The drain select transistor DST may be connected to a drain select line DSL1. First to nth memory cells MC1 to MCn may be connected to first to nth word lines WL1 to WLn, respectively. The source select transistor SST may be connected to a source select line SSL1. A drain of the drain select transistor DST may be connected to a corresponding bit line. The drain select transistors of the first to mth cell strings CS1 to CSm may be connected to the first to mth bit lines BL1 to BLm, respectively. A source of the source select transistor SST may be connected to a common source line CSL (not shown).

The drain select line DSL1, the first to nth word lines WL1 to WLn, and the source select line SSL1 are included in the row lines RL of FIG. 2. The drain select line DSL1, the first to nth word lines WL1 to WLn, and the source select line SSL1 are controlled by the address decoder 121 of FIG. 2. The common source line CSL is controlled by the control logic 125. The first to mth bit lines BL1 to BLm are controlled by the read/write circuit 123.

Referring back to FIG. 2, the peripheral circuit 120 may include the address decoder 121, a voltage generator 122, the read/write circuit 123, a data input/output circuit 124, and the control logic 125.

The address decoder 121 may be connected to the memory cell array 110 through the row lines RL. The address decoder 121 may operate in response to control of the control logic 125. The address decoder 121 receives an address ADDR through the control logic 125.

In some embodiments, program and read operations of the semiconductor memory device 100 are performed in units of pages. In programming, the address ADDR may include a block address and a row address.

The address decoder 121 may decode a block address in the received address ADDR. The address decoder 121 selects one memory block among the memory blocks BLK1 to BLKz according to the decoded block address.

The address decoder 121 may decode a row address in the received address ADDR. The address decoder 121 selects one word line of the selected memory block by applying voltages provided from the voltage generator 122 to the row lines RL according to the decoded row address.

For a program operation, the address decoder 121 may apply a program pulse to the selected word line and apply, to unselected word lines, a pass pulse lower than the program pulse. For a program verify operation, the address decoder 121 may apply a verification voltage to the selected word line and apply, to the unselected word lines, a verification pass voltage higher than the verification voltage.

In some embodiments, the address decoder 121 under the control of the control logic 125 may support the program operation including a main program operation and an additional program operation. In the additional program operation, a verify operation is first performed, and it may be determined whether an additional program pulse is to be applied, based on the verification result.

In some embodiments, an erase operation of the semiconductor memory device 100 is performed in units of memory blocks. In the erase operation, the address ADDR may include a block address. The address decoder 121 decodes a block address and selects one memory block according to the decoded block address.

In an embodiment, the address decoder 121 may include a block decoder, a word line decoder, an address decoder, and the like.

The voltage generator 122 may generate a plurality of voltages by using an external power voltage supplied to the semiconductor memory device 100. The voltage generator 122 may operate in response to the control of the control logic 125.

The voltage generator 122 may generate an internal power voltage by regulating the external power voltage. The internal power voltage generated by the voltage generator 122 may be used as an operation voltage of the semiconductor memory device 100.

The voltage generator 122 may generate a plurality of voltages by using an external power voltage or an internal power voltage. For example, the voltage generator 122 may include a plurality of pumping capacitors for receiving an internal power voltage, and may generate a plurality of voltages by selectively activating the plurality of pumping capacitors in response to control of the control logic 125. The plurality of voltages may be applied to selected word lines by the address decoder 121.

For a program operation, the voltage generator 122 may generate a high-voltage program pulse and a pass pulse lower than the program pulse. For a program verify operation, the voltage generator 122 may generate a verification voltage and a verify pass voltage higher than the verification voltage.

The read/write circuit 123 may include first to mth page buffers PB1 to PBm. The first to mth page buffers PB1 to PBm may be connected to the memory cell array 110 through the respective first to mth bit lines BL1 to BLm. The first to mth page buffers PB1 to PBm may operate in response to control of the control logic 125.

The first to mth page buffers PB1 to PBm may communicate data with the data input/output circuit 124. For a program operation, the first to mth page buffers PB1 to PBm may receive data DATA to be stored through the data input/output circuit 124 and data lines DL.

For programming, when a program pulse is applied to a selected word line, the first to mth page buffers PB1 to PBm may transmit, to selected memory cells, the data DATA received through the data input/output circuit 124 through the bit lines BL1 to BLm. Memory cells of a selected page may be programmed according to the transmitted data DATA. A memory cell connected to a bit line to which a program permission voltage (e.g., a ground voltage) is applied may have an increased threshold voltage. The threshold voltage of a memory cell connected to a bit line to which a program prohibition voltage (e.g., a power voltage) is applied may be maintained. For a program verify operation, the first to mth page buffers PB1 to PBm may read page data from the selected memory cells through the bit lines BL1 to BLm.

For a read operation, the read/write circuit 123 may read data DATA from the memory cells of the selected page through the bit lines BL, and output the read data DATA to the data input/output circuit 124. For an erase operation, the read/write circuit 123 may float the bit lines BL.

In an embodiment, the read/write circuit 123 may include a column select circuit.

The data input/output circuit 124 may be connected to the first to mth page buffers PB1 to PBm through the data lines DL. The data input/output circuit 124 may operate in response to control of the control logic 25. For programming, the data input/output circuit 124 may receive data DATA to be stored from an external controller (not shown).

The control logic 125 may be connected to the address decoder 121, the voltage generator 122, the read/write circuit 123, and the data input/output circuit 124. The control logic 125 may control one or more operations of the semiconductor memory device 100. For example, the control logic 125 may receive a command CMD and an address ADDR from the external controller. The control logic 125 may control the address decoder 121, the voltage generator 122, the read/write circuit 123, and the data input/output circuit 124 in response to the command CMD. The control logic 125 may transmit the address ADDR to the address decoder 121.

In an embodiment, when a command CMD (hereinafter, referred to as a program command) indicating programming is received, the control logic 125 may perform at least one program operation on selected memory cells. For a program operation, a program voltage (or pulse) may be applied to a selected word line. If the program voltage is applied, the control logic 125 may perform at least one verify operation, and output a state fail signal or a state pass signal to the external controller, based on the performance result.

Page data read from the selected memory cells in a verify operation may be arbitrarily stored in the first to mth page buffers PB1 to PBm. The first to mth page buffers PB1 to PBm may transmit a verification result to the control logic 125 in response to control of the control logic 125.

Figure 4:
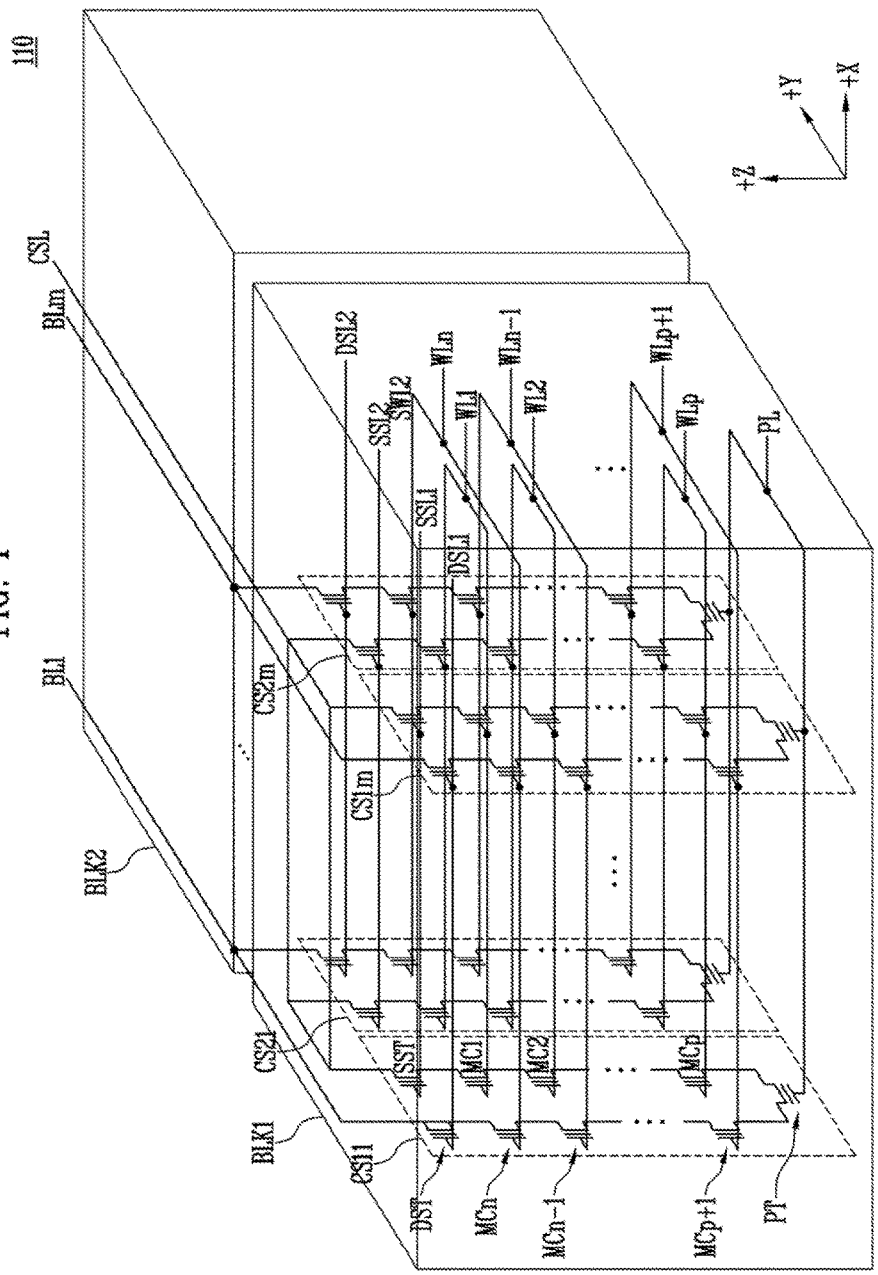
FIG. 4 is a diagram illustrating a structure of a memory cell array, according to another embodiment of the present invention.

FIG. 4 is a diagram illustrating a structure of a memory cell array, according to another embodiment of the present invention. For example, the memory cell array of FIG. 4 may be the memory cell array 110 of FIG. 2.

Referring to FIG. 4, the memory cell array 110 may include a plurality of memory blocks BLK1 to BLKz. For convenience of illustration, an internal configuration of a first memory block BLK1 is illustrated, and internal configurations of the other memory blocks BLK2 to BLKz are omitted. It will be understood that second to zth memory blocks BLK2 to BLKz may also be configured similarly to the first memory block BLK1.

The first memory block BLK1 may include a plurality of cell strings CS11 to CS1m and CS21 to CS2m. In an embodiment, each of the plurality of cell strings CS11 to CS1m and CS21 to CS2m may be formed in a 'U' shape. In the first memory block BLK1, m cell strings may be arranged in a row direction (i.e., a +X direction). It is illustrated that two cell strings may be arranged in a column direction (i.e., a +Y direction). However, this is for convenience of illustration, and it will be understood that three or more cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have similar structures. In some embodiments, each of the select transistors SST and DST and the memory cells MC1 to MCn may include a channel layer, a tunneling insulating layer, a charge storage layer, and a blocking insulating layer. In some embodiments, a pillar for providing the channel layer may be provided to each cell string. In some embodiments, a pillar for providing at least one of the channel layer, the tunneling insulating layer, the charge storage layer, and the blocking insulating layer may be provided to each cell string.

The source select transistor SST of each cell string may be connected between a common source line CSL and memory cells MC1 to MCp.

In an embodiment, source select transistors SST of cell strings arranged in the same row may be connected to a source select line extended in the row direction, and source select transistors of cell strings arranged in different rows may be connected to different source select lines DSL1. Source select transistors SST of cell strings CS11 to CS1m in a first row may be connected to a first source select line SSL1. Source select transistors of cell strings CS21 to CS2m in a second row may be connected to a second source select line SSL2.

In an embodiment, the source select transistors SST of the cell strings CS11 to CS1m and CS21 to CS2m may be commonly connected to one source select line.

The first to nth memory cells MC1 to MCn of each cell string may be connected between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp are sequentially arranged in a direction opposite to a +Z direction, and connected in series between the source select transistor SST and the pipe transistor PT. The (p+1)th to nth memory cells MCp+1 to MCn are sequentially arranged in the +Z direction, and connected in series between the pipe transistor PT and the drain select transistor DST. The first to pth memory cells MC1 to MCp and the (p+1)th to nth memory cells MCp+1 to MCn may be connected to each other through the pipe transistor PT. Gates of the first to nth memory cells MC1 to MCn of each cell string may be connected to first to nth word lines WL1 to WLn, respectively.

In an embodiment, at least one of the first to nth memory cells MC1 to MCn may be used as a dummy memory cell. When the dummy memory cell is provided, the voltage or current of a corresponding cell string can be stably controlled. Accordingly, it is possible to improve the reliability of data stored in the memory block BLK1.

A gate of the pipe transistor PT of each cell string may be connected to a pipe line PL.

The drain select transistor DST of each cell string may be connected between a corresponding bit line and the memory cells MCp+1 to MCn. The cell strings arranged in the row direction may be connected to a drain select line extended in the row direction. The drain select transistors of the cell strings CS11 to CS1m in the first row may be connected to a first drain select line DSL1. The drain select transistors of the cell strings CS21 to CS2m in the second row may be connected to a second drain select line DSL2.

Cell strings arranged in the column direction may be connected to a bit line extended in the column direction. The cell strings CS11 and CS21 in a first column may be connected to a first bit line BL1. The mth cell strings CS1m and CS2m may be connected to an mth bit line BLm.

Memory cells connected to the same word line in cell strings arranged in the row direction may constitute one page. For example, memory cells connected to a first word line WL1 in the cell strings CS11 to CS1m in the first row may constitute one page. Memory cells connected to the first word line WL1 in the cell strings CS21 to CS2m in the second row may constitute another page. Any one of the drain select lines DSL1 and DSL2 is selected, so that cell strings arranged in one row direction can be selected. Any one of the word lines WL1 to WLn is selected, so that one page in the selected cell strings can be selected.

Figure 5:
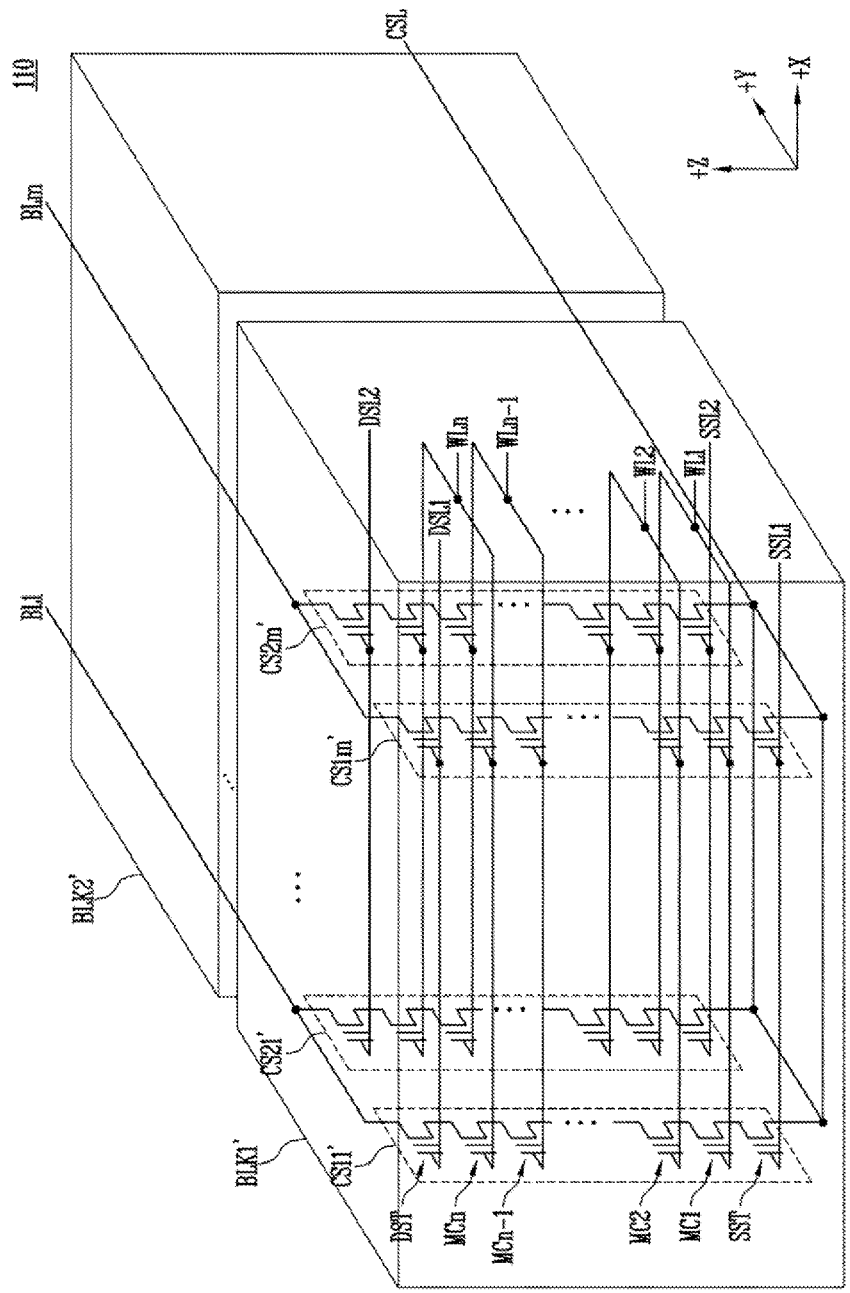
FIG. 5 is a diagram illustrating a structure of a memory cell array, according to yet another embodiment of the present invention.

FIG. 5 is a diagram illustrating a structure of a memory cell array according to still another embodiment of the present invention. For example, the memory cell array of FIG. 5 may be the memory cell array 110 of FIG. 2.

Referring to FIG. 5, the memory cell array 110 may include a plurality of memory cells BLK1' to BLKz'. For convenience of illustration, an internal configuration of a first memory block BLK1' is illustrated, and internal configurations of the other memory blocks BLK2' to BLKz' are omitted. It will be understood that second to zth memory blocks BLK2' to BLKz' are also configured identically to the first memory block BLK1'.

The first memory block BLK1' may include a plurality of cell strings CS11' to CS1m' and CS21' to CS2m'. Each of the plurality of cell strings CS11' to CS1m' and CS21' to CS2m' may extend along the +Z direction. In the first memory block BLK1', m cell strings may be arranged in the +X direction. It is illustrated that two cell strings may be arranged in the +Y direction. However, this is for convenience of illustration, and it will be understood that three or more cell strings may also be arranged in the column direction.

Each of the plurality of cell strings CS11' to CS1m' and CS21' to CS2m' may include at least one source select transistor SST, first to nth memory cells MC1 to MCn, and at least one drain select transistor DST.

The source select transistor SST of each cell string may be connected between a common source line CSL and the memory cells MC1 to MCn. Source select transistors SST of cell strings arranged in the same row may be connected to the same source select line. Source select transistors SST of cell strings CS11' to CS1m' arranged in a first row may be connected to a first source select line SSL1. Source select transistors SST of cell strings CS21' to CS2m' arranged in a second row may be connected to a second source select line SSL2. In a different configuration, the source select transistors SST of the cell strings CS11' to CS1m and CS21' to CS2m' may be commonly connected to one source select line.

The first to nth memory cells MC1 to MCn of each cell string may be connected in series between the source select transistor SST and the drain select transistor DST. Gates of the first to nth memory cells MC1 to MCn may be connected to first to nth word lines WL1 to WLn, respectively.

In an embodiment, at least one of the first to nth memory cells MC1 to MCn may be used as a dummy memory cell. When the dummy memory cell is provided, the voltage or current of a corresponding cell string can be stably controlled. Accordingly, it is possible to improve the reliability of data stored in the memory block BLK1'.

The drain select transistor DST of each cell string may be connected between a corresponding bit line and the memory cells MC1 to MCn. The drain select transistors DST of the cell strings in the row direction may be connected to a drain select line extended in the row direction. The drain select transistors DST of the cell strings CS11' to CS1$m$' in the first row may be connected to a first drain select line DSL1. The drain select transistors DST of the cell strings CS21' to CS2$m$' in the second row may be connected to a second drain select line DSL2.

Consequently, the memory block BLK1' of FIG. 5 may have a similar equivalent circuit to the memory block BLK1 of FIG. 4, except that the pipe transistor PT is excluded from each cell string.

Figure 6:
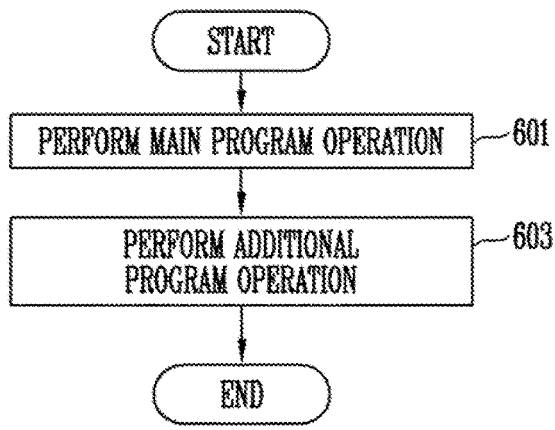
FIG. 6 is a flowchart illustrating a program operation of a memory device, according to an embodiment of the present invention.

FIG. 6 is a flowchart illustrating a program operation of a memory device according to an embodiment of the present invention. For example, the program operation of FIG. 6 may be performed by the memory device 100 of FIG. 2.

A program operation may be performed as the application of a pulse and a read operation using a verification voltage are repeated. A double verify operation may be used in which two verification voltages are used for every program loop for a program verify operation of selected memory cells. In a double verify operation, each of the threshold voltages of the selected memory cells are detected twice by using a second verification voltage as a target verification voltage and a first verification voltage lower than the target verification voltage in a state in which the selected memory cells are programmed and, based on the detection result, the selected memory cells may be divided into first memory cells of which threshold voltages are lower than the first verification voltage, second memory cells of which threshold voltages are higher than the first verification voltage and lower than the second verification voltage, and third memory cells of which threshold voltages are higher than the second verification voltage. In a double verify operation, the first and second memory cells each of which threshold voltage is lower than the second verification voltage may repeatedly perform a program operation by using an incremental step pulse programming (ISSP) scheme in which programming is again performed by using a program voltage higher than a program voltage used in a previous program operation.

In a double verify operation, a programming time tPROG may increase as a verify process is repeated. A programming operation of embodiments may include a main program operation and an additional program operation. The main program operation may be performed by using a single verify operation or a normal verify operation. After the main program operation is finished, the formation of a threshold voltage distribution may be completed through an additional program.

Referring to FIG. 6, the memory device 100 may perform a main program operation (601). If the main program operation is completed, the memory device 100 may perform an additional program (603).

The main program operation may be performed as the application of a program pulse and a read operation (verify operation) using a verification voltage are repeated. Specifically, memory cells to be programmed may be programmed to respectively have different program states according to data to be stored. The number of program states may be changed depending on the number of bits of the data stored in the memory cells.

A program state may be divided based on the threshold voltage of a memory cell. In general, when a memory cell is programmed to have any one program state among first to Nth program states, a memory cell in a high program state may be programmed to have a higher threshold voltage distribution than a memory cell in a relatively low program state. A program operation may be sequentially performed while proceeding from the first program state to the Nth program state.

The threshold voltages of memory cells connected to a selected word line may be increased through the application of a program pulse. In this case, a program permission voltage (e.g., 0V) may be applied to bit lines to which the memory cells are connected. A pass voltage may be applied to unselected word lines while the program pulse is being applied.

For a verify operation, in a program state, a verification voltage with respect to the program state may be applied, and an output of a bit line may be read according to the applied verification voltage, thereby determining whether memory cells are programmed. The verification voltage may be a read voltage with respect to each program state. The verification result of a memory cell may be a pass when the threshold voltage of the corresponding memory cell is higher than the verification voltage, and may be a fail when the threshold voltage of the corresponding memory cell is lower than the verification voltage. For the programmed memory cells succeeding in verification, the program pulse and the verification voltage may be applied continuously to the word lines. A program prohibition voltage (e.g., Vcc) may be applied to the bit lines.

At the completion of the main program operation each memory cell connected to a selected word line may be programmed to have a threshold voltage corresponding to the target program state. In this case, a program pulse may be continuously applied to memory cells programmed to have a low program state until the main program operation is completed. Therefore, the threshold voltages of the memory cells may be changed due to characteristics of the memory cells, such as interference or disturbance of the memory cells with adjacent memory cells, and the like for the time required until the main program operation is completed.

According to an embodiment of the present invention, the semiconductor memory device may perform an additional program operation on memory cells having changed threshold voltages. The additional program operation will be described in detail with reference to FIG. 7. For example, the program operation of FIG. 7 may be performed by the memory device 100 of FIG. 2. The additional program operation of FIG. 7 may be corresponding to the operation 603 of FIG. 6.

Figure 7:
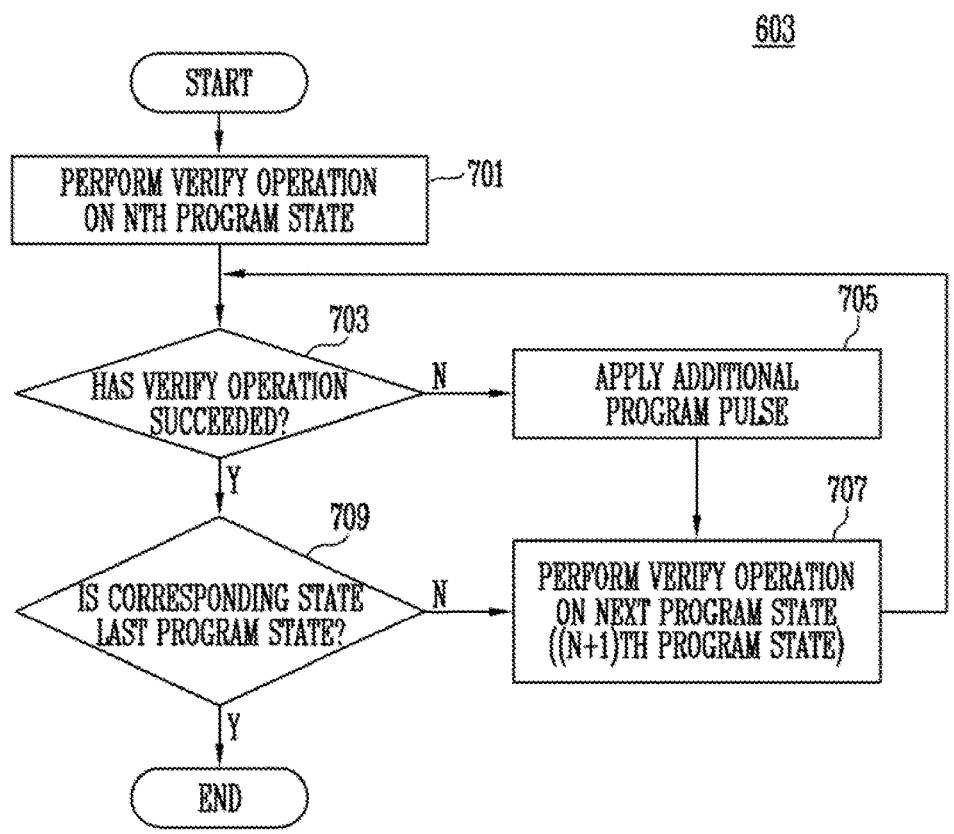
FIG. 7 is a flowchart illustrating an additional program operation of a memory device according to an embodiment of the present invention.

Referring to FIG. 7, in step 701, the semiconductor memory device 100 may perform a verify operation on an Nth program state. Here, N may be an integer of 1 or more. A verify operation on a program state may be performed by applying a verification voltage in the corresponding program state to a selected word line and verifying the program state through bit line sensing.

In step 703, the semiconductor memory device 100 may determine whether the verify operation on the Nth program state may have succeeded as a result obtained by performing the verify operation in step 701. When the verify operation succeeds, the additional program operation may proceed to step 709.

If the verify operation fails (No in step 703), it can be seen that the threshold voltages of each memory cell using the corresponding program state as a target program state are changed. In this case, the additional program operation may proceed to step 705.

In step 705, the semiconductor memory device 100 may apply, to the selected word line, an additional program pulse for programming the memory cells to the corresponding state. In this case, a program permission voltage may be applied to a bit line of the memory cells using the corresponding program state as the target program state, and a program prohibition voltage may be applied to bit lines of the other memory cells.

In various embodiments, the program prohibition voltage may be applied to bit lines of memory cells using, as the target program state, a program state lower than a corresponding program state, and the program permission voltage may be applied to a bit line of memory cells using, as the target program state, a program state equal to or higher than the corresponding program state.

In step 707, the semiconductor memory device 100 does not perform a verify operation on a change in threshold voltage due to the application of an additional program pulse, but may perform a verify operation on a next program state (i.e., (N+1)th program state). The verify operation may be performed in the same manner as the verify operation described through step 701.

When the verify operation succeeds (Yes in step 703), the semiconductor memory device 100 may determine whether the corresponding program state is the last program state in step 709. When the corresponding program is the last program state as the determination result, the additional program operation on all the program states may have been performed, and hence the additional program operation is completed.

When the verify operation is not the verify operation on the last program state as the determination result in step 709, the additional program operation may proceed to step 707 to perform a verify operation on the next program state (i.e., (N+1)th program state). The verify operation may be performed in the same manner as the verify operation through step 701.

According to the described embodiments of the present invention, the semiconductor memory device may perform a program operation on memory cells using a plurality of program states as target program states, and perform an additional program operation only for those memory cells for which the threshold voltage may have changed, by verifying again the threshold voltages of the memory cells after all main program operations are completed. Thus, it is possible to correct changed threshold voltages. Also, since the verify operation may be performed in a very short time, it is possible to improve the overall program time tPROG.

Figure 8:
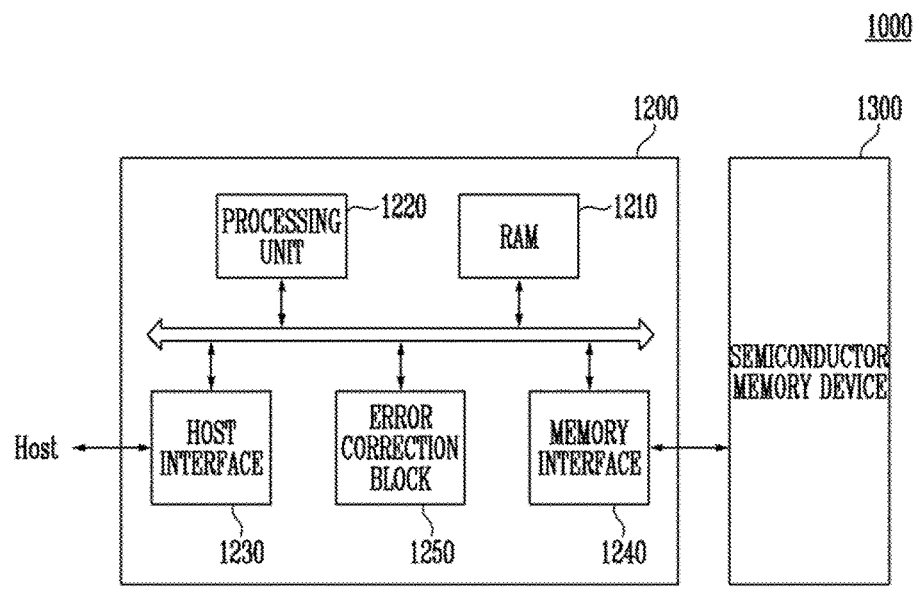
FIG. 8 is a block diagram illustrating a memory system including a memory device, according to an embodiment of the present invention.

FIG. 8 is a block diagram illustrating a memory system 1000 including a memory device, according to an embodiment of the present invention.

Referring to FIG. 8, the memory system 1000 may include a semiconductor memory device 1300 and a controller 1200.

The semiconductor memory device 1300 may be configured and operated identically to the semiconductor memory device 100 described with reference to FIG. 1. Hereinafter, overlapping descriptions will be omitted.

The controller 1200 may be connected to a host (not shown) and the semiconductor memory device 1300. The controller 1200 may access the semiconductor memory device 1300 in response to a request from the host. For example, the controller 1200 may control one of read, write, erase, and background operations of the semiconductor memory device 1300. The controller 1200 may provide an interface between the semiconductor memory device 1300 and the host. The controller 1200 may drive firmware for controlling the semiconductor memory device 1300.

The controller 1200 may include a random access memory (RAM) 1210, a processing unit 1220, a host interface 1230, a memory interface 1240, and an error correction block 1250.

The RAM 1210 is used as at least one of an operation memory of the processing unit 1220, a cache memory between the semiconductor memory device 1300 and the host, and a buffer memory between the semiconductor memory device 1300 and the host.

The processing unit 1220 may control the overall operations of the controller 1200.

The processing unit 1220 may randomize data received from the host. For example, the processing unit 1220 may randomize the data received from the host by using a randomizing seed. The randomized data is provided to be stored to the semiconductor memory device 1300, to be programmed to the memory cell array of the memory device 1300.

The processing unit 1220 may derandomize data received from the semiconductor memory device 1300 in a read operation. For example, the processing unit 1220 may derandomize the data received from the semiconductor memory device 1300 by using a derandomizing seed. The derandomized data may be output to the host.

In some embodiments, the processing unit 1220 may perform randomizing and derandomizing by driving software or firmware.

The host interface 1230 may include a protocol for exchanging data between the host and the controller 1200. In some embodiments, the controller 1200 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol and the like.

The memory interface 1240 may interface with the semiconductor memory device 1300. For example, the memory interface 1240 may include a NAND or a NOR interface.

The error correction block 1250 may detect and correct error data received from the semiconductor memory device 1300 by using an error correction code (ECC).

The controller 1200 and the semiconductor memory device 1300 may be integrated into a semiconductor device. In some embodiments, the controller 1200 and the semiconductor memory device 1300 may be integrated into a semiconductor device, to constitute a memory card. For example, the controller 1200 and the semiconductor memory device 1300 may be integrated into a semiconductor device, to constitute a memory card such as a PC card (personal computer memory card international association (PCM-CIA)), a compact flash (CF) card, a smart media card (SM or SMC), a memory stick, a multimedia card (MMC, RS- MMC or MMCmicro), an SD card (SD, miniSD, microSD or SDHC), a universal flash storage (UFS), and the like.

The controller 1200 and the semiconductor memory device 1300 may be integrated into one semiconductor device to constitute a semiconductor drive such as a solid state drive (SSD). The semiconductor drive may include a storage device configured to store data in a semiconductor memory. If the memory system 1000 is used as the semiconductor drive, the operating speed of the host connected to the memory system 1000 may be substantially improved.

In an embodiment, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telemetics network, an RFID device, one of various components that constitute a computing system, and the like.

In some embodiments, the semiconductor memory device 1300 or the memory system 1000 may be packaged in various forms. For example, the semiconductor memory device 1300 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 9:
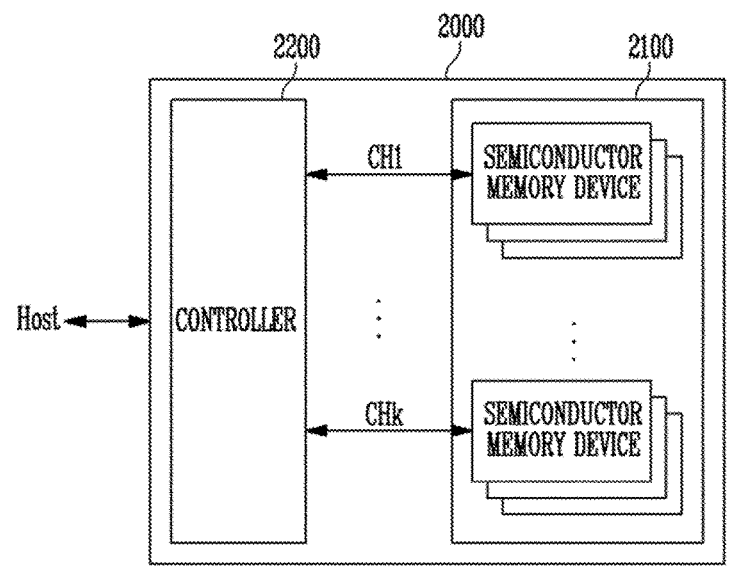
FIG. 9 is a block diagram illustrating an application example of a memory system, according to an embodiment of the present invention.

FIG. 9 is a block diagram illustrating an application example of a memory system 2000, according to an embodiment of the present invention.

Referring to FIG. 9, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

The plurality of groups may communicate with the controller 2200 through first to kth channels CH1 to CHk. Each semiconductor memory chip may be configured and operate like any one of the semiconductor memory devices 100 described with reference to FIG. 1.

Each group may communicate with the controller 2200 through a common channel. The controller 2200 may be configured similarly to the controller 1200 described with reference to FIG. 8. The controller 2200 may control the plurality of memory chips of the semiconductor memory device 2100 through the plurality of channels CH1 to CHk.

It has been illustrated that a plurality of semiconductor memory chips may be connected to one channel. However, it will be understood that the memory system 2000 may be modified such that one semiconductor memory chip may be connected to one channel.

Figure 10:
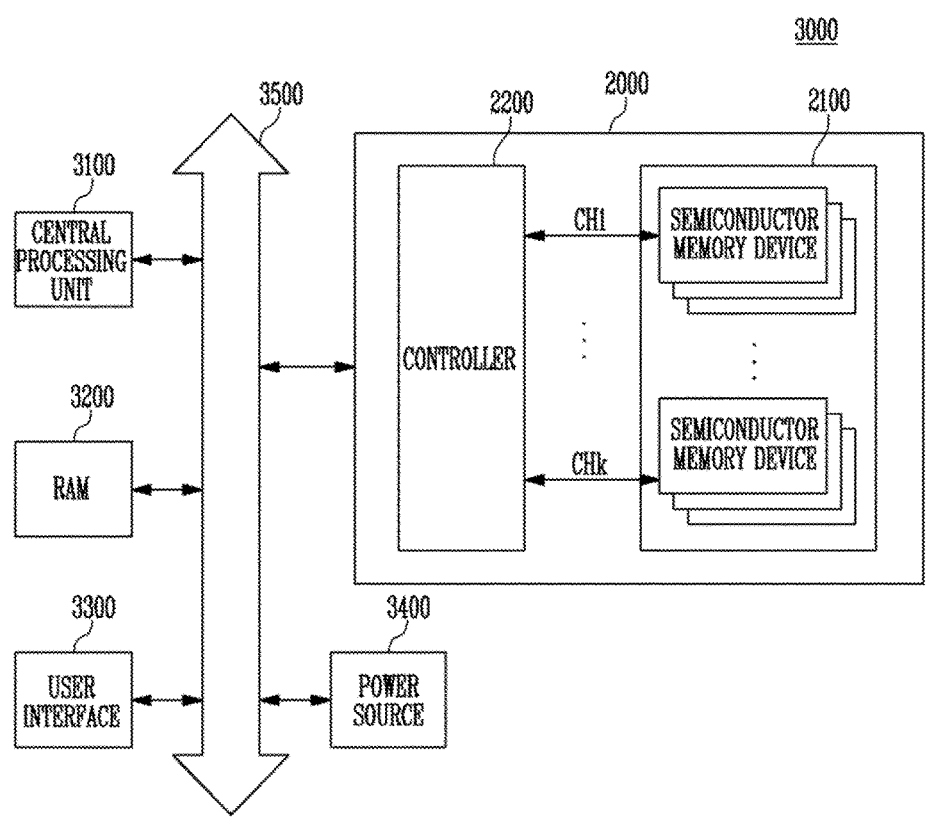
FIG. 10 is a block diagram illustrating a computing system including a memory system, according to an embodiment of the present invention.

FIG. 10 is a block diagram illustrating a computing system 3000 including a memory system, according to an embodiment of the present invention. For example, the memory system of FIG. 10 may be the memory system 2000 of FIG. 9.

Referring to FIG. 10, the computing system 3000 may include a central processing unit 3100, a RAM 3200, a user interface 3300, a power source 3400, a system bus 3500, and the memory system 2000.

The memory system 2000 is electrically connected to the central processing unit 3100, the RAM 3200, the user interface 3300, and the power source 3400 through the system bus 3500. Data supplied through the user interface 3300 or data processed by the central processing unit 3100 may be stored in the memory system 2000.

It is illustrated that the semiconductor memory device 2100 may be connected to the system bus 3500 through the controller 2200. Alternatively, the semiconductor memory device 2100 may be directly connected to the system bus 3500. In this case, the function of the controller 2200 may be performed by the central processing unit 3100 and the RAM 3200.

It is illustrated that the memory system 2000 described with reference to FIG. 10 is provided. Alternatively, the memory system 2000 may be replaced by the memory system 1000 described with reference to FIG. 8. In some embodiments, the computing system 3000 may be configured to include both the memory systems 1000 and 2000 described with reference to FIGS. 8 and 9.

According to the present invention, it is possible to provide a semiconductor memory device having improved reliability and an operating method thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of operating a memory device, the method comprising:
 performing a main program operation on a plurality of memory cells to program the plurality of memory cells to one or more program states corresponding to one or more threshold voltages, the main program operation comprising applying a program pulse to the plurality of memory cells and verifying the plurality of memory cells; and
 performing an additional program operation on at least one memory cell having a threshold voltage which is changed during the main program operation, the additional program operation comprising an additional verification on the at least one memory cell and an application of an additional program pulse onto the at least one memory cell on which the additional verification fails,
 wherein the additional program operation is performed after the main program operation on all of the plurality of memory cells is completed.

2. The method of claim 1, wherein the performing of the main program operation comprises:
applying the program pulse to a selected word line; and
verifying the program state of each of the plurality memory cells.

3. The method of claim 2, wherein the performing of the main program operation further comprises:
repeating the applying of the program pulse and the verifying of the program states of the memory cells until the threshold voltage of each memory cell reaches a target program state.

4. The method of claim 2, wherein the verifying the program states of the memory cells comprises applying verification voltages having the same level as read voltages of the program states.

5. The method of claim 4, further comprising:
determining whether the verification for each of the memory cells has passed or failed, based on a comparison between the threshold voltages of the memory cells and the verification voltages.

6. The method of claim 1, wherein the performing of the additional program operation comprises:
performing the additional verification of the program states of the memory cells by using verification voltages corresponding to target program states of the memory cells; and
performing, to a selected word line, the application of the additional program pulse corresponding to program states where the additional verification fails.

7. The method of claim 1, wherein the performing of the additional program operation comprises:
performing the additional verification of the program states of the memory cells by using verification voltages corresponding to target program states of the memory cells; and
performing, to a selected word line, the application of the additional program pulse corresponding to a program state where the additional verification fails and the application of the additional program pulse corresponding to a program state higher than the program state where the additional verification fails.

8. The method of claim 1, wherein the performing of the additional program operation comprises:
performing the additional verification on a memory cell programmed to have an arbitrary program state among the one or more program states by using a verification voltage corresponding to the arbitrary program state;
determining, based on a result of the additional verification, whether to perform the application of the additional program pulse corresponding to the arbitrary program state; and
performing, regardless of a result of determination, the additional verification on a memory cell programmed to have another program state different from the arbitrary program state.

9. The method of claim 8, further comprising:
performing, when the additional verification fails, the application of the additional program pulse corresponding to the arbitrary program state onto the memory cell programmed to have the arbitrary program state.

10. The method of claim 1, wherein the main program operation on all of the plurality of memory cells is completed when each of all of the plurality of memory cells is programmed to have a threshold voltage corresponding to a target program state.

11. A memory device, comprising:
a plurality of memory cells each programmed to have any one program state among a plurality of program states divided based on a threshold voltage thereof; and
a peripheral circuit configured to perform a main program operation on the plurality of memory cells, and perform an additional program operation on at least one memory cell of which a threshold voltage regarding the main program operation is changed while the main program operation is being performed,
wherein the main program operation comprises applying a program pulse to the plurality of memory cells and verifying the plurality of memory cells,
wherein the additional program operation comprising an additional verification on the at least one memory cell and an application of an additional program pulse onto memory cell on which the additional verification fails, and
wherein the peripheral circuit performs the additional program operation after the main program operation on all of the plurality of memory cells is completed.

12. The memory device of claim 11, wherein the peripheral circuit applies the program pulse to a word line to which the plurality of memory cells are connected, and verifies the program states of the plurality of memory cells by using verification voltages.

13. The memory device of claim 12, wherein the peripheral circuit applies the program pulse to the word line to which the plurality of memory cells are connected until each of the threshold voltages of the memory cells reaches a target program state.

14. The memory device of claim 12, wherein the peripheral circuit determines whether the verification for each of the memory cells has passed or failed, based on a comparison between the threshold voltages of the memory cells and the verification voltages.

15. The memory device of claim 12, wherein the verification voltages have the same level as read voltages of the program states.

16. The memory device of claim 11, wherein the peripheral circuit performs the additional verification of the program states of the plurality of memory cells by using verification voltages corresponding to target program states of the plurality of memory cells, and performs, to the word line, the application of the additional program pulse corresponding to program states where the additional verification fails.

17. The memory device of claim 11, wherein the peripheral circuit performs the additional verification of the program states of the plurality of memory cells by using verification voltages corresponding to target program states of the plurality of memory cells, and performs, to the word line, the application of the additional program pulse corresponding to a program state where the additional verification fails and the application of the additional program pulse corresponding to a program state higher than the program state where the additional verification fails.

18. The memory device of claim 11, wherein the peripheral circuit performs the additional verification on a memory cell programmed to have an arbitrary program state among the one or more program states by using a verification voltage corresponding to the arbitrary program state, determines, whether to perform the application of the additional program pulse corresponding to the arbitrary program state based on a result of the additional verification, and performs, regardless of a result of determination, the additional verification on a memory cell programmed to have another program state different from the arbitrary program state.

19. The memory device of claim 18, wherein the peripheral circuit performs, when the additional verification fails, the application of the additional program pulse corresponding to the arbitrary program state onto the memory cell programmed to have the arbitrary program state.

20. The memory device of claim 11, wherein the main program operation on all of the plurality of memory cells is completed when each of all of the plurality of memory cells is programmed to have a threshold voltage corresponding to a target program state.

* * * * *